(12) United States Patent
Lin et al.

(10) Patent No.: US 6,651,013 B1
(45) Date of Patent: Nov. 18, 2003

(54) METHOD AND APPARATUS FOR DETERMINING THE LOCATION OF A SHORT IN AN ELECTRICAL WIRE NETWORK

(75) Inventors: How T. Lin, Vestal, NY (US); Christopher J. Majka, Owego, NY (US); Matthew Francis Seward, Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 09/714,372

(22) Filed: Nov. 16, 2000

(51) Int. Cl.[7] .............................................. G01R 31/00
(52) U.S. Cl. ......................... 702/59; 702/57; 702/58; 702/64; 702/65; 702/69; 702/183
(58) Field of Search ............................. 702/57–59, 64, 702/65, 67, 69, 117, 118, 124, 126, 125, 183, 121, 189, FOR 103–106, FOR 109, FOR 134, FOR 170, FOR 171; 340/660, 661, 662, 663, 664; 324/508, 522, 509, 523, 524, 527, 525, 537, 555, 691, 713; 361/92, 93, 88, 35; 370/242

(56) References Cited

U.S. PATENT DOCUMENTS

| | | | |
|---|---|---|---|
| 2,243,259 A | | 5/1941 | Pierce |
| 4,110,683 A | | 8/1978 | Cason et al. |
| 4,446,421 A | | 5/1984 | Berde |
| 4,568,872 A | | 2/1986 | Heller et al. |
| 4,605,827 A | | 8/1986 | Chattler |
| 4,656,416 A | * | 4/1987 | Brasfield .................... 324/133 |
| 5,087,874 A | * | 2/1992 | Robinson .................... 324/523 |
| 5,162,742 A | * | 11/1992 | Atkins et al. ................ 324/512 |
| 5,299,139 A | * | 3/1994 | Baisuck et al. ................ 716/5 |
| 5,359,291 A | * | 10/1994 | Dommerich, III .......... 324/522 |
| 5,432,460 A | * | 7/1995 | Flecha et al. ................ 324/537 |
| 5,485,094 A | * | 1/1996 | Endoh et al. ............. 324/158.1 |
| 5,539,306 A | * | 7/1996 | Riggio, Jr. ................ 324/158.1 |
| 5,682,100 A | * | 10/1997 | Rossi et al. .................. 324/532 |
| 5,701,081 A | * | 12/1997 | Rapaport ..................... 324/511 |
| 6,219,335 B1 | * | 4/2001 | Luk et al. .................... 370/222 |
| 6,242,923 B1 | * | 6/2001 | Scaman et al. ............. 324/529 |
| 2002/0053912 A1 | * | 5/2002 | Saha et al. .................. 324/525 |

FOREIGN PATENT DOCUMENTS

| | | |
|---|---|---|
| DE | 126 549 | 7/1977 |
| DE | 232 767 | 2/1986 |
| DE | 41 30 051 | 3/1993 |
| EP | 0 964 256 | 12/1999 |

* cited by examiner

Primary Examiner—Marc S. Hoff
Assistant Examiner—Carol S W Tsai
(74) Attorney, Agent, or Firm—Schmeiser, Olsen & Watts; Arthur J. Samodovitz

(57) ABSTRACT

A method and apparatus for locating a short between two nets in an electrical wire network of a microelectronic structure (e.g., chip, chip carrier, circuit card, etc.). A first net and a second net of the electrical wire are electrically shorted at an unknown point $P_S$ on the first net. Points $P_A$ and $P_B$ on the first net such are selected such that $P_S$ is located on a path between $P_A$ and $P_B$ along the first net. A constant current pulse source is electrically connected between $P_A$ and $P_B$ and is activated. Voltage drops $V_{AB}$ (from $P_A$ to $P_B$) and $V_{AC}$ (from $P_A$ to a point $P_C$ on the second net) are measured. A length $L_{AS}$ of the path from $P_A$ to $P_S$ is calculated as a function of $V_{AC}/V_{AB}$. Computer graphics may be used to graphically display the location of the short within the microelectronic structure.

45 Claims, 4 Drawing Sheets

METHOD AND APPARATUS FOR DETERMINING THE LOCATION OF A SHORT IN AN ELECTRICAL WIRE NETWORK

BACKGROUND OF THE INVENTION

1. Technical Field

The present invention relates to a method and apparatus for locating an electrical short between two nets in an electrical wire network.

2. Related Art

Current technology is unable to accurately, efficiently, and nondestructively locate an electrical short between two nets in an electrical network of a microelectronic structure (e.g., a circuit board).

A method and apparatus is needed for accurately, efficiently, and nondestructively locating an electrical short between two nets in an electrical network of a microelectronic structure.

SUMMARY OF THE INVENTION

The present invention provides a method for locating a short between a first net and a second net, comprising the steps of:

providing the first net and the second net, wherein the second net is electrically shorted to the first net at an unknown point $P_S$ on the first net;

selecting points $P_A$ and $P_B$ on the first net such that $P_S$ is at a location on a path between $P_A$ and $P_B$ along the first net;

electrically connecting a constant current pulse source between $P_A$ and $P_B$;

electrically connecting a first voltage measuring device between $P_A$ and $P_B$;

selecting a point $P_C$ on the second net;

electrically connecting a second voltage measuring device between $P_A$ and $P_C$;

activating the constant current pulse source to generate a constant current pulse at a time t=0, wherein the constant current pulse has a width $\tau$ and a height I;

activating the first voltage measuring device at a time $t_1$, wherein $0<t_1<\tau$, and wherein the first voltage measuring device records a voltage drop $V_{AB}$ from $P_A$ to $P_B$;

activating the second voltage measuring device at a time $t_2$, wherein $0<t_2<\tau$, and wherein the second voltage measuring device records a voltage drop $V_{AC}$ from $P_A$ to $P_C$;

defining $L_{AS}$ as a length of the path from $P_A$ to $P_S$; and calculating $L_{AS}$ as a function of $V_{AC}/V_{AB}$.

The present invention provides an apparatus for locating a short between a first net and a second net, comprising:

the first net and the second net, wherein the second net is electrically shorted to the first net at an unknown point $P_S$ on the first;

points $P_A$ and $P_B$ on the first net such that $P_S$ is at a location on a path between $P_A$ and $P_B$ along the first net;

a constant current pulse source electrically connected to $P_A$ and $P_B$, wherein the constant current pulse source is generating a constant current pulse having a pulse width $\tau$ and pulse height I;

a first voltage measuring device electrically connected between $P_A$ and $P_B$, wherein the first voltage measuring device is recording a voltage drop $V_{AB}$ from $P_A$ to $P_B$; and a second voltage measuring device electrically connected between $P_A$ and a point $P_C$ on the second net, wherein the second voltage measuring device is recording a voltage drop $V_{AC}$ from $P_A$ to $P_C$; and a calculation algorithm which computes $L_{AS}$ as a function of $V_{AC}/V_{AB}$, wherein $L_{AS}$ is a length of the path from $P_A$ to $P_S$.

The present invention provides a computer method for locating a short between a first net and a second net such that the short is at a point $P_S$ at a location on a path between points $P_A$ and $P_B$ on the first net, comprising the steps of:

providing a computer system having:
  a memory device;
  a computer code located on the memory device, said computer code including a calculational algorithm which calculates a length $L_{AS}$ along the path from $P_A$ to $P_S$;
  a processor for executing the computer code; and
  an output device;

providing input data for the computer code, including: a voltage drop $V_{AB}$ from $P_A$ to $P_B$, a voltage drop $V_{AC}$ from $P_A$ to a point $P_C$ on the second net, and geometric data describing a spatial distribution of an electrical wire network which includes the first net;

executing the computer code, wherein the calculational algorithm computes a length $L_{AS}$ of the path from $P_A$ to $P_S$ as a function of $V_{AC}/V_{AB}$ including utilizing the geometric data; and displaying $L_{AS}$ by the output device.

The present invention provides a computer system for locating a short between a first net and a second net such that the short is at a point $P_S$ at a location on a path between points $P_A$ and $P_B$ on the first net, comprising:

a memory device;

input data stored for use by a computer code, said input data including: a voltage drop $V_{AB}$ from $P_A$ to $P_B$, a voltage drop $V_{AC}$ from $P_A$ to a point $P_C$ on the second net, and geometric data describing a spatial distribution of an electrical wire network which includes the first net;

the computer code located on the memory device, wherein the computer code includes a calculation algorithm which utilizes $V_{AC}$, $V_{AB}$, and the geometric data to calculate a length $L_{AS}$ along the path from $P_A$ to $P_S$ as a function of $V_{AC}/V_{AB}$;

a processor which executes the computer code; and an output device which receives output from the computer code, said output including output data selected from the group consisting of $L_{AS}$, a graphical image displaying a location of the short, and a combination thereof.

The present invention provides a computer program product, comprising:

a computer usable medium having a computer readable program code embodied therein for locating a short between a first net and a second net such that the short is at a point $P_S$ at a location on a path between points $P_A$ and $P_B$ on the first net, wherein the computer readable program code includes:

a utilization of input data for locating the short, wherein the input date comprises: a voltage drop $V_{AB}$ from $P_A$ to $P_B$, a voltage drop $V_{AC}$ from $P_A$ to a point $P_C$ on the second net, and geometric data describing a spatial distribution of an electrical wire network which includes the first net and the second net, and a calculation of locational information selected from the group consisting of a length $L_{AS}$ along the path from $P_A$ to $P_S$ as a function of $V_{AC}/V_{AB}$, a graphical image displaying a location of the short, and a combination thereof.

The present invention provides a method, apparatus, and computer program product for accurately, efficiently, and nondestructively locating an electrical short between two nets in an electrical network of a microelectronic structure.

DETAILED DESCRIPTION OF THE INVENTION

Figure 1:
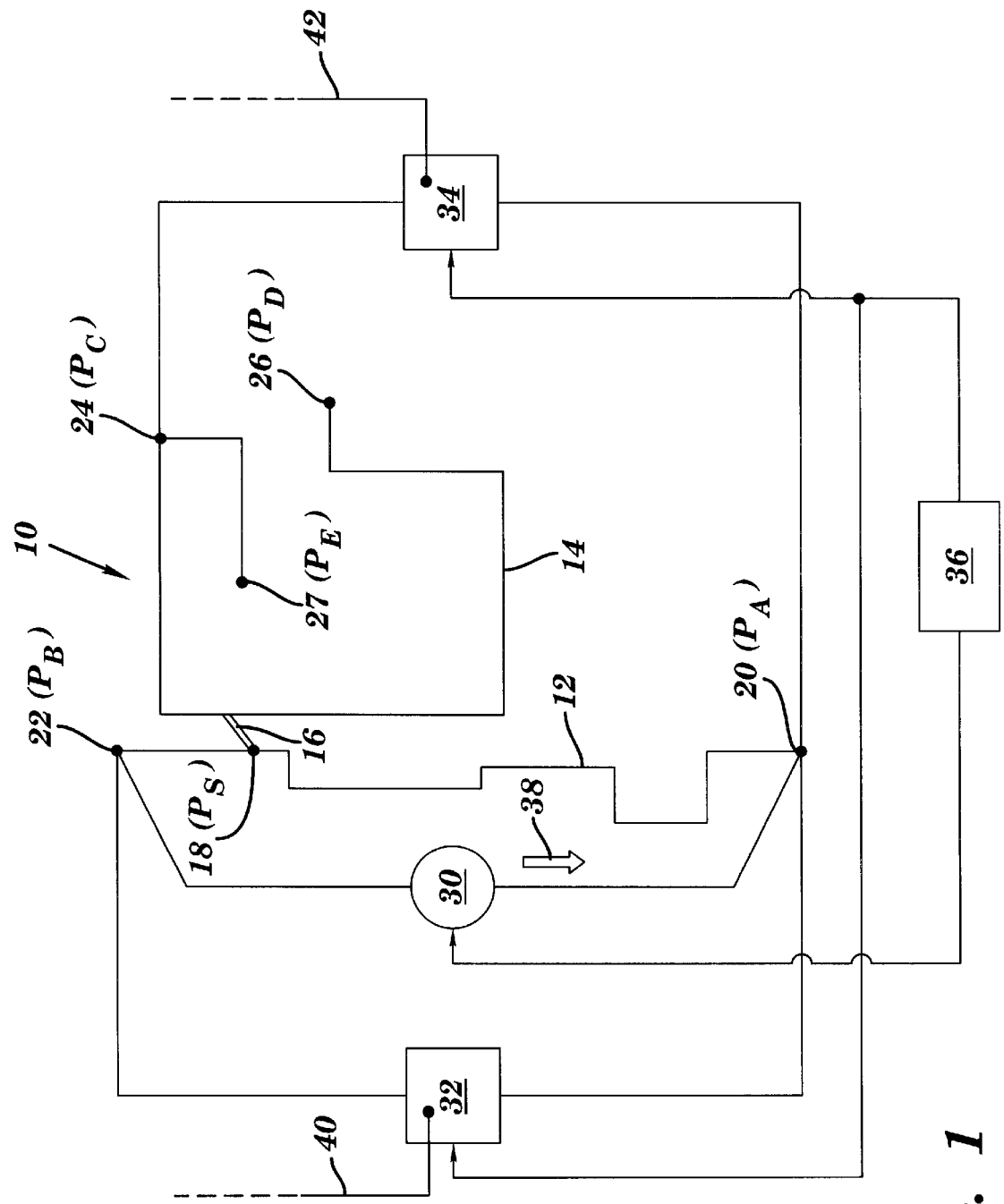
FIG. 1 depicts an apparatus for locating an electrical short between a first net and a second net, said apparatus including a constant current pulse source, in accordance with embodiments of the present invention.

FIG. 1 illustrates an apparatus 10 for locating an electrical short ("short") 16 between a first net 12 and a second net 14, in accordance with embodiments of the present invention. A net is defined as a continuous path of electrically conductive wiring within an electrical wire network. The electrical wire network may be included within a microelectronic structure such as, inter alia, a chip, a chip carrier, or a circuit card.

Figure 2:
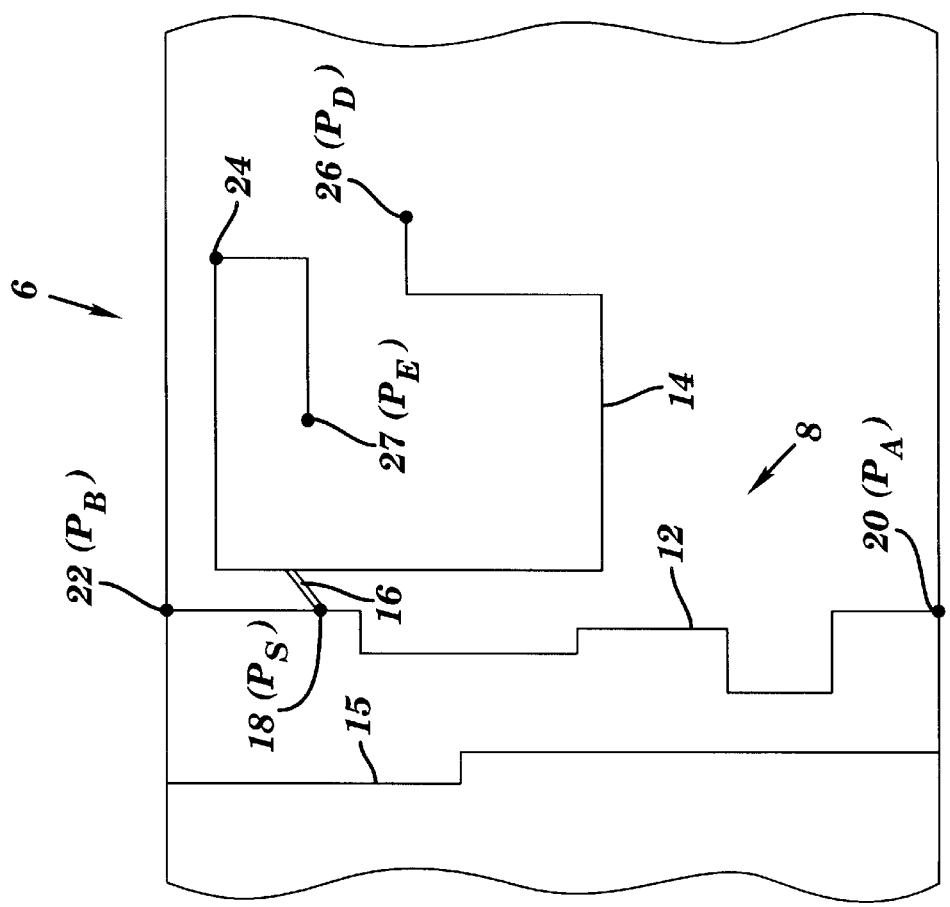
FIG. 2 depicts a microelectronic structure which includes the first net and the second net of FIG. 1.

FIG. 2 illustrates a microelectronic structure 6 which comprises an electrical wire network 8. The electrical wire network 8 includes from FIG. 1: the first net 12, the second net 14, and the short 16 between the first net 12 and the second net 14. The electrical wire network 8 also includes a third net 15 as illustrative of the fact that the electrical wire network 8 generally includes two or more nets. Each net of the electrical wire network 8, including the first net 12 and the second net 14, may be have any geometric configuration, such as, inter alia, a conductive wire of a constant cross sectional area, a connected series of conductive wires with each conductive wire having an independent cross sectional area, a conductive wire having a straight-line shape or a curved shape, etc. The points 20 and 22, denoted respectively as $P_A$ and $P_B$, are fixed points (e.g., end points) of the first net 12. Additionally, the points 20 and 22 are any two points on the first net 12 such that the point 18 ($P_S$) of the short 16 is between the points 20 and 22. The points 26 and 27, denoted respectively as $P_D$ and $P_E$, are fixed points (e.g., end points) of the second net 14.

Figure 3:
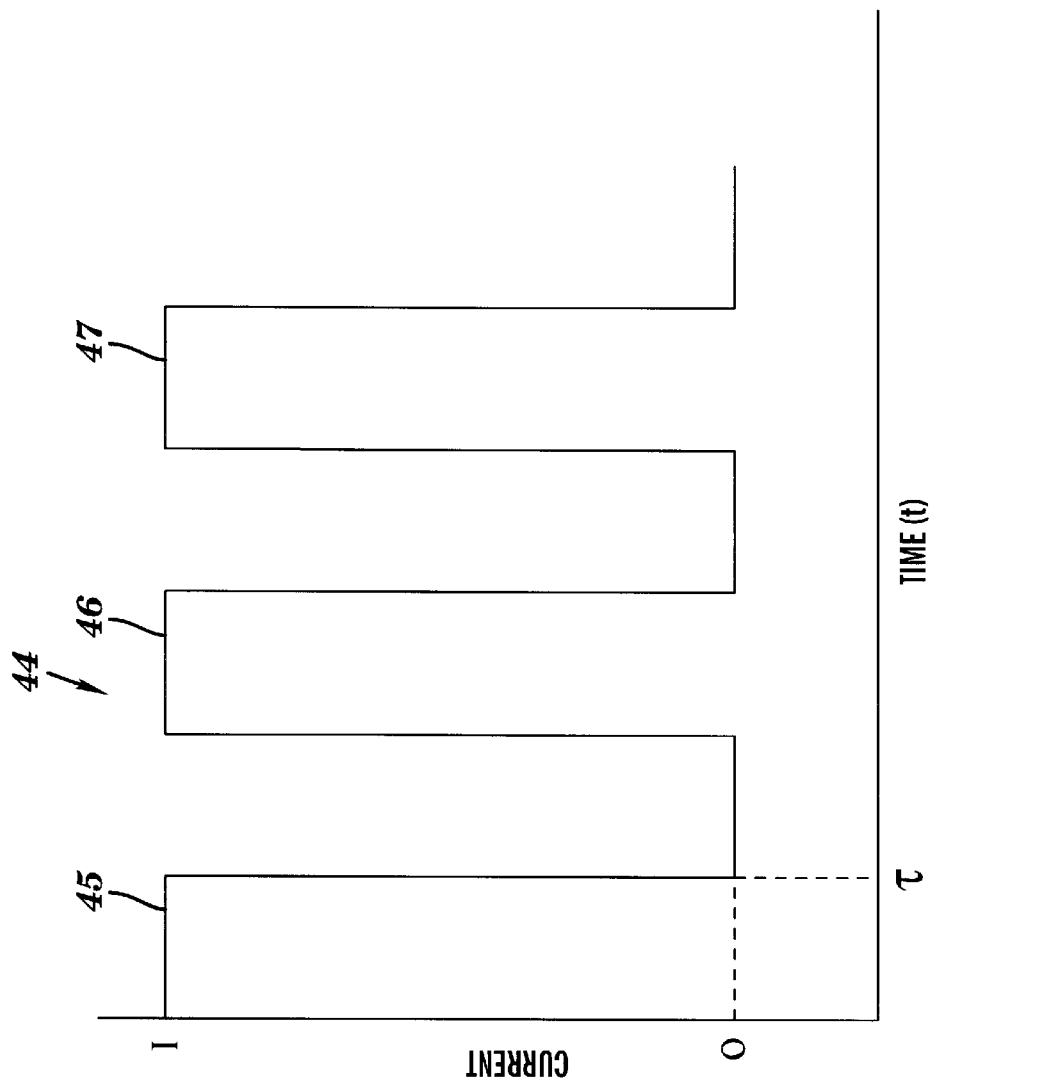
FIG. 3 depicts a time dependence of current as outputted by the constant current pulse source of FIG. 1.

Returning to FIG. 1, the present invention is directed to locating the short 16; i.e., locating the point 18 ($P_S$) on the first net 12 at which the short 16 is located. A constant current pulse source 30 is connected across point 20 (i.e., $P_A$) and point 22 (i.e., $P_B$) of the first net 12. FIG. 3 depicts a time dependence of current 44 as outputted by the constant current pulse source 30 of FIG. 1. The current 44 comprises a sequence of time-interrupted current pulses 45, 46, 47, etc., such that each current pulse 45, 46, 47, etc. has a width τ and a height I. As will be discussed infra, τ has a small value that depends on I.

Returning to FIG. 1, a first voltage measuring device 32 is electrically connected between the point 20 ($P_A$) and the point 22 ($P_B$) A second voltage measuring device 34 is electrically connected between the point 20 ($P_A$) and a point 24 (denoted as point $P_C$) on the second net 14. The first voltage measuring device 32 and the second voltage measuring device 34 may each be any voltage measuring device (e.g., an analog to digital converter) which can measure a voltage at any given time. It is assumed that the input impedance of the second voltage measuring device 34 is sufficiently large in comparison with any length of wiring in the second net 14 and with the electrical resistance of the short 16, so that a negligible current flows into the second net 14 in comparison with the current that flows in the first net 12 when the constant current pulse source 30 is activated. It is further assumed that the input impedance of the first voltage measuring device 32 is sufficiently large that negligible current flows through the first voltage measuring device 32 in comparison with the current in the first net 12 when the constant current pulse source 30 is activated. An analog to digital converter typically has a high input impedance such as from tens of kohms to hundreds of kohms.

A timing control 36 activates the constant current pulse source 30 to generate the current 44 of FIG. 3 in the direction 38, starting with the pulse 45 at time t=0. The timing control 36 also activates the first voltage measuring device 32 a time $t_1$, wherein $0<t_1<\tau$. Upon said activation, the first voltage measuring device 32 measures and records a voltage drop $V_{AB}$ from point 20 to point 22 (i.e., $P_A$ to $P_B$) Similarly, the timing control 36 also activates the second voltage measuring device 34 at a time $t_2$, wherein $0<t_2<\tau$. The times $t_1$ and $t_2$ may be about equal to each other, or may differ. Upon said activation, the second voltage measuring device 34 measures and records a voltage drop $V_{AC}$ from point 20 to point 24 (i.e., $P_A$ to $P_C$). Thus, both $V_{AB}$ and $V_{AC}$ are measured and recorded after the pulse 45 has been activated and before the pulse 45 has lapsed. The constant current pulse source 30 should be deactivated by the timing control 36 before,the pulse 46 (see FIG. 3) is generated. Both $V_{AB}$ and $V_{AC}$ will be used for locating the point 18 ($P_S$).

Since the point 20 ($P_A$) is a known point on the first net 12, the point 18 ($P_S$) may be located by calculating the distance $L_{AS}$ along the path of the first net 12 from the point 20 ($P_A$) to the point 18 ($P_S$) as follows. Let s be a path length variable along the path from the point 20 ($P_A$) to the point 22 ($P_B$) such that s=0 at $P_A$. Then $L_{AS}$ may be expressed as ∫ds from the point 20 ($P_A$) to the point 18 ($P_S$). Also, the distance $L_{AB}$ along the path from the point 20 ($P_A$) to the point 22 ($P_B$) may be expressed as ∫ds from the point 20 ($P_A$) to the point 22 ($P_B$). It is assumed that $L_{AB}$ is known or can be computed from given electrical resistance data of the electrical wire network 8 (see FIG. 2).

Let R(s) denote a unit electrical resistance at a position s on the path. The unit electrical resistance R(s) is defined as an electrical resistance per unit length along the path such that an electrical resistance between two points $s_\alpha$ and $s_\beta$ on the path is the integral ∫R(s)ds evaluated along the path from $s_\alpha$ to $s_\beta$. Since the point 20 ($P_A$), the point 22 ($P_B$), and R(s) are known, the electrical resistance $R_{AB}$ between the points 20 and 22 can be easily computed as $R_{AB}$=∫R(s)ds evaluated along the path from the point 20 ($P_A$) to the point 22 ($P_B$). Under the assumptions stated supra concerning the high input impedance of both the first voltage measuring device 32 and the second voltage measuring device 34, activation of the constant current pulse source 30 by the timing control 36 generates a voltage divider along the path on the first net 12. If R(s) is constant (i.e., independent of s) along the path from the point 20 ($P_A$) to the point 22 ($P_B$), then the voltage divider enables $L_{AS}$ to be calculated according to:

$$L_{AS}=L_{AB}\ (V_{AC}/V_{AB}) \quad (1)$$

As stated supra, Equation (1) applies to situations in which R(s) is uniform (i.e., constant) along the path from the point 20 ($P_A$) to the point 22 ($P_B$). Nonetheless R(s) could vary along the path from the point 20 ($P_A$) to the point 22 ($P_B$), since, inter alia, the wiring cross-sectional area could vary, or the conductive material along the path could vary, along the path from the point 20 ($P_A$) to the point 22 ($P_B$).

Generally, regardless of whether R(s) is constant along the path from the point 20 ($P_A$) to the point 22 ($P_B$), the voltage divider results in the following equation:

$$\int_0^{L_{AS}} R(s)ds = R_{AB}(V_{AC}/V_{AB}) \qquad (2)$$

Equation (2) is valid generally, including cases of: R(s) is constant along the path, R(s) is piecewise constant along the path, R(s) is piecewise continuous along the path, etc. R(s) is piecewise constant along the path if the path can be divided into one or more intervals or "pieces" such that R(s) is constant in each such piece. R(s) is piecewise continuous along the path if the path can be divided into one or more intervals or "pieces" such that R(s) is continuous in each such piece. Since Equation (2) is a nonlinear equation in a single real variable $L_{AS}$, Equation (3) may be solved for $L_{AS}$ (for given values of $R_{AB}$, $V_{AC}$, and $V_{AB}$) by any of numerous methods known to one of ordinary skill in numerical analysis or applied mathematics.

The width $\tau$ of the constant current pulse 45 must be sufficiently small in accordance with the following discussion. With circuit lines going from layer to layer in a circuit board within inches or less of travel, it is necessary to accurately determine where the short 16 (i.e., the point 18 ($P_S$)) is located. Determining $P_S$ by passing a normal current (e.g., about 1 ampere or larger) through the first net 12 may destroy the first net 12, because circuit line traces, such as the first net 12, have very small cross sectional areas (e.g., less than about 1 square mil) in microelectronic structures such as circuit boards and are thus incapable of accommodating such normal currents. Reducing the current would result in reduced measured voltages, and reduced voltages are more difficult to read accurately. Additionally, reduced voltages yield reduced resolution and therefore a less accurate determination of where the short 16 is located. Rather than reduce the current I, the present invention reduces $\tau$ to a sufficiently small value such that an amount of energy associated with the current I is too small to damage or destroy the circuit lines. The following discussion describes how to limit $\tau$ to a sufficiently small value, in accordance with the present invention.

In order to avoid wire damage, the time-integrated power ($P\tau$, wherein P denotes power) associated with current I flowing in a given length L of wire having a cross-sectional area A and an associated electrical resistance R must not exceed a value C, wherein C is yet to be determined. It is recognized that a very thick wire may be able to accommodate a fixed power P, while a very thin wire may be damaged or destroyed for the same fixed power P. In particular, a maximum power which may be accommodated without damage by a wire having the cross-sectional area A increases as A increases and for some conductive materials is approximately proportional to A. Accordingly if the maximum allowable power is proportional to A, in consideration of the fact that $P=I^2R$ and that R is proportional to 1/A, it follows that $(I^2/A)\tau \leq CA$, or $\tau \leq CA^2/I^2 \qquad (3)$ wherein C is a constant to be determined. The following two facts, as established by the inventors of the present invention, enable C to be determined. The first fact is that a 10 ampere current could flow through a first circuit line having a cross-section area of 1 mil² for a time of 1 millisecond without damaging the circuit line. The second fact is that a 10 ampere current could flow through a second circuit line having a cross-section area of 0.3 mil² for a time of 100 microseconds without damaging the circuit line. C=100 is inferred by applying Equation (3) to the first fact, and C=111 is inferred by applying Equation (3) to the second fact. Thus using C=100 in Equation (3), which is conservative relative to both the first fact and the second fact, Equation (3) becomes:

$\tau < 100A^2/I^2 \qquad (4)$

A computer code programmed in accordance with a calculational algorithm, based on Equation (1) or Equation (2) or both, can be used to compute $L_{AS}$. For implementing Equation (1), the computer code would be provided with $V_{AC}$, $V_{AB}$, and $L_{AB}$. The voltage drops $V_{AC}$ and $V_{AB}$ are obtained from voltage measurements as described supra. $L_{AB}$ can be provided as input, or can be computed by the computer code based on given geometric data describing a spatial distribution of the first net 12 within an electrical wire network which includes the first net 12. For implementing Equation (2), the computer code would be provided with $V_{AC}$, $V_{AB}$, and $R_{AB}$. The voltage drops $V_{AC}$ and $V_{AB}$ are obtained from voltage measurements as described supra. $V_{AC}$ and $V_{AB}$ can be communicated to the computer code either by direct electrical communication from the first and second measuring devices 32 and 34, respectively (see FIG. 4 and accompanying description), or by indirect information transfer such as by hand input. $R_{AB}$ can be provided as input, or can be computed by the computer code based on: given geometric data describing a spatial distribution of the first net 12 within an electrical wire network which includes the first net 12; and given electrical resistance data which describes a distribution of electrical resistance within the first net 12. In practice, the computer code may have access to a database that generally describes both: a geometrical description of the electrical wire network; and electrical resistance data describing the distribution of electrical resistance within the electrical wire network. When working with the aforementioned database, identification of the first net should be communicated to the computer code, such as via user input.

While Equation (1) or Equation (2) may be used to compute the length $L_{AS}$ along the path from the point 20 ($P_A$) to the point 18 ($P_S$), $L_{AS}$ is only a scalar quantity and not a three-dimensional vector. Thus, knowledge of length $L_{AS}$ by itself does not directly indicate exactly where the point 18 ($P_S$) is located on the path or within the microelectronic structure (e.g., the electrical wire network 8 within the microelectronic structure 6 of FIG. 2, discussed supra) in which the first net 12 and the second net 14 are located. From a geometrical description of the first net 12 in relation to the microelectronic structure in which the first net 12 is located, however, a precise location of 18 ($P_S$) can be calculated and displayed once the value $L_{AS}$ is known. If said geometrical description is a schematic drawing, for example, the various lengths along the path starting at the point 20 ($P_A$) can be cumulated to a sum until a particular point on the path is reached such that the sum is about equal to $L_{AS}$ at the particular point. Then the particular point so determined is the point 18 ($P_S$). In that manner, the point 18 ($P_S$) can be identified on the schematic drawing.

An analogous procedure for locating the point 18 ($P_S$) utilizes existing computer software such as a commercial computer graphics design program (e.g., CADENCE, DELTACAD, etc.) to graphically (i.e., pictorially) display, or otherwise identify, the location of the point 18 ($P_S$) on a computer screen or in a printed description, graphic, or picture. Just about all printed circuit boards (PCBs), except the most simple PCBs, have been designed using a computer graphics design program. Such design programs allow the user of the design program to view all layers that make up the circuit board, and to follow any circuit line from layer to layer and end to end. The part number of the circuit board may be entered by the user, which triggers access to data of the circuit board including artwork of the circuit board. Circuit line tracking is within the capabilities of these systems, so that following along the circuit lines until $L_{AS}$ has been tracked yields the exact location of the short inside the circuit board. With existing computer graphics design programs, however, finding the location of the point 18 ($P_S$) would not be automated because such programs are unable to calculate $L_{AS}$. Nonetheless, locating the point 18 ($P_S$) could be accomplished by combining existing graphics capabilities of these design programs with hand calculation of the cumulative path length from the point 20 ($P_A$) until the cumulative path length is about equal to $L_{AS}$.

A procedure for automating locating the point 18 ($P_S$) requires writing new computer graphics software (or program) that is specifically tailored to locating the point 18 ($P_S$). Such new computer graphics software would automate and combine the calculation of $L_{AS}$ with graphical display capabilities similar to those described supra in relation to existing computer graphics design programs. The new computer graphics software must be provided with geometric data describing a spatial distribution of an electrical wire network which includes the first net and the second net. Additionally, if Equation (2) is implemented, the new computer graphics software would also require electrical resistance data describing the distribution of electrical resistance within the electrical wire network.

Figure 4:
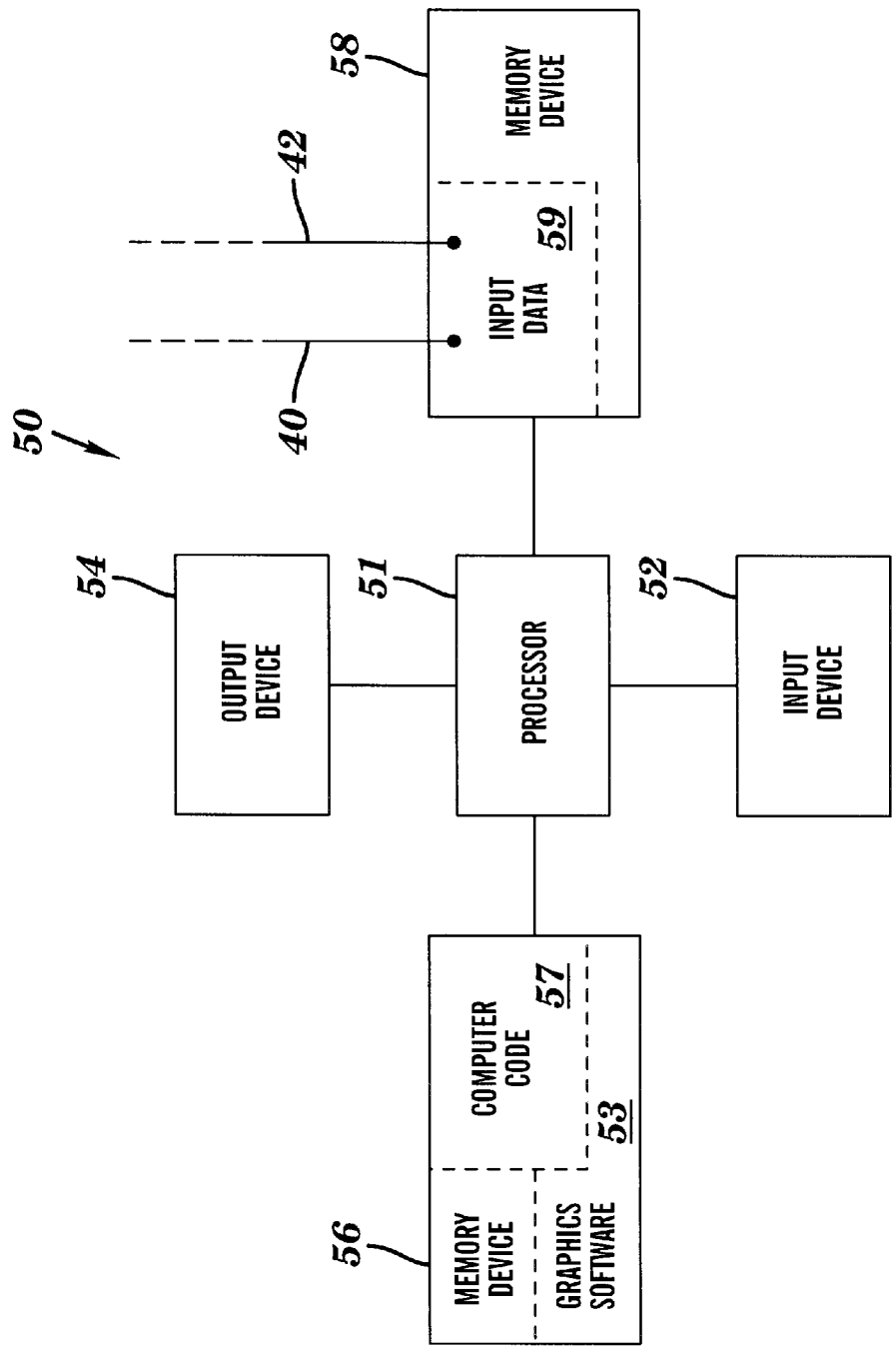
FIG. 4 depicts a computer system for computing the location of the electrical short of FIG. 1.

FIG. 4 illustrates a computer system 50 which comprises a processor 51, an input device 52 coupled to the processor 51, an output device 54 coupled to the processor 51, and memory devices 56 and 58 each coupled to the processor 51. The input device 52 may be, inter alia, a keyboard, a mouse, etc. The output device 54 may be, inter alia, a printer, a plotter, a computer screen, a magnetic tape, a removable hard disk, a floppy disk, etc. The memory devices 56 and 58 may be, inter alia, a hard disk, a dynamic random access memory (DRAM), a read-only memory (ROM), etc. The memory device 56 includes a computer code 57 and graphics software 53. The computer code 57 includes a calculational algorithm, based on Equation (1) or Equation (2) or both, for computing $L_{AS}$, as described supra herein. The graphics software 53 may include an existing computer graphics design program as describes supra, or newly written computer graphics software as describes supra. The computer code 57 and the graphics software 53 may be independent (as shown in FIG. 4) or coupled together such as in the newly written computer graphics software. The processor 51 executes the computer code 57 and the graphics software 53. The memory device 58 includes input data 59. The input data 59 includes input required by the computer code 57 and the graphics software 53, as described supra herein. The output device 54 displays output (such as the output described supra herein) from the computer code 57 and the graphics software 53.

The computer system 50 may also include a first conductive line 40 and a second conductive line 42, as shown with ends in the memory device 58. The first conductive line 40 and a second conductive line 42 are respectively connected to the first voltage measuring device 32 and the second voltage measuring device 34 (see FIG. 1), which enables the measured voltage drop $V_{AB}$ to be directly transferred from the first voltage measuring device 32 to the memory device 58, and the measured voltage drop $V_{AC}$ to be directly transferred from the second voltage measuring device 34 to the memory device 58. While FIG. 4 shows the first conductive line 40 and the second conductive line 42 as terminating at the memory device 58, the first conductive line 40 and the second conductive line 42 may terminate at any other location within the computer system 50 such that $V_{AB}$ and $V_{AC}$ can be made accessible to the calculational algorithm of the computer code 57.

While FIG. 4 shows the computer system 50 as a particular configuration of hardware and software, any configuration of hardware and software, as would be known to a person of ordinary skill in the art, may be utilized for the purposes stated supra in conjunction with the particular computer system 50 of FIG. 4. For example, the memory devices 56 and 58 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for locating a short between a first net and a second net, comprising the steps of:

providing the first net and the second net, wherein the second net is electrically shorted to the first net at an unknown point $P_S$ on the first net;

selecting points $P_A$ and $P_B$ on the first net such that $P_S$ is at a location on a path between $P_A$ and $P_B$ along the first net;

electrically connecting a constant current pulse source between $P_A$ and $P_B$;

electrically connecting a first voltage measuring device between $P_A$ and $P_B$;

selecting a point $P_C$ on the second net;

electrically connecting a second voltage measuring device between $P_A$ and $P_C$;

activating the constant current pulse source to generate a constant current pulse at a time t=0, wherein the constant current pulse has a width $\tau$ and a height I;

activating the first voltage measuring device at a time $t_1$, wherein $0<t_1<\tau$, and wherein the first voltage measuring device records a voltage drop $V_{AB}$ from $P_A$ to $P_B$;

activating the second voltage measuring device at a time $t_2$, wherein $0<t_2<\tau$, and wherein the second voltage measuring device records a voltage drop $V_{AC}$ from $P_A$ to $P_C$;

defining $L_{AS}$ as a length of the path from $P_A$ to $P_S$; and calculating $L_{AS}$ as a function of $V_{AC}/V_{AB}$.

2. The method of claim 1, wherein a unit electrical resistance is constant along the path, wherein the method further comprises providing a length $L_{AB}$ of the path from $P_A$ to $P_B$, and wherein the calculating step includes computing $L_{AS}$ according to $L_{AS}=L_{AB}(V_{AC}/V_{AB})$.

3. The method of claim 1, further comprising:

defining s as a path length variable along the path such that s=0 at $P_A$;

providing a unit electrical resistance R(s) along the path;

defining $R_{AB}$ as an integral $\int R(s)ds$ over the path from $P_A$ to $P_B$;

providing or computing $R_{AB}$, and wherein the calculating step includes solving the following equation for $L_{AS}$:

$$\int_0^{L_{AS}} R(s)ds = R_{AB}(V_{AC}/V_{AB}).$$

4. The method of claim 3, wherein R(s) is piecewise constant over the path.

5. The method of claim 3, wherein R(s) is piecewise continuous over the path.

6. The method of claim 1, further comprising determining the location of $P_S$ on the first net.

7. The method of claim 6, further comprising graphically displaying the location of $P_S$ on the first net.

8. The method of claim 7, wherein said graphically displaying is accomplished by using computer software having access to data which describes the first net geometrically.

9. The method of claim 1, wherein τ is no greater than about $100A^2/I^2$, wherein A is in units of square mils, wherein I is in units of amperes, and wherein τ is in units of milliseconds.

10. The method of claim 9, wherein A is no greater than about 1 square mil.

11. The method of claim 9, wherein I is at least about 1 ampere.

12. The method of claim 1, further comprising providing a microelectronic structure which includes the first net and the second net.

13. The method of claim 12, wherein the microelectronic structure is selected from the group consisting of a chip, a chip carrier, and a circuit card.

14. The method of claim 1, wherein $t_2$ is about equal to $t_1$.

15. An apparatus for locating a short between a first net and a second net, comprising:

the first net and the second net, wherein the second net is electrically shorted to the first net at an unknown point PS on the first;

points $P_A$ and $P_B$ on the first net such that $P_S$ is at a location on a path between $P_A$ and $P_B$ along the first net;

a constant current pulse source electrically connected to $P_A$ and $P_B$, wherein the constant current pulse source is generating a constant current pulse having a pulse width τ and pulse height I;

a first voltage measuring device electrically connected between $P_A$ and $P_B$, wherein the first voltage measuring device is recording a voltage drop $V_{AB}$ from $P_A$ to $P_B$; and a second voltage measuring device electrically connected between $P_A$ and a point $P_C$ on the second net, wherein the second voltage measuring device is recording a voltage drop $V_{AC}$ from $P_A$ to $P_C$; and a calculation algorithm which computes $L_{AS}$ as a function of $V_{AC}/V_{AB}$, wherein $L_{AS}$ is a length of the path from $P_A$ to $P_S$.

16. The apparatus of claim 15, wherein a unit electrical resistance R(s) is constant along the path, wherein a length $L_{AB}$ of the path from $P_A$ to $P_B$ has been provided, and wherein the calculation algorithm computes $L_{AS}$ according to $L_{AS}=L_{AB}(V_{AC}/V_{AB})$.

17. The apparatus of claim 15, wherein s is defined as a path length variable along the path such that s=0 at $P_A$, wherein a unit electrical resistance R(s) along the path has been provided, wherein $R_{AB}$ is an integral $\int R(s)ds$ over the path from $P_A$ to $P_B$, wherein $R_{AB}$ has been provided, and wherein the calculation algorithm solves the following equation for $L_{AS}$:

$$\int_0^{L_{AS}} R(s)ds = R_{AB}(V_{AC}/V_{AB}).$$

18. The apparatus of claim 17, wherein R(s) is piecewise constant over the path.

19. The apparatus of claim 17, wherein R(s) is piecewise continuous over the path.

20. The apparatus of claim 15, further comprising a location algorithm for determining the location of $P_S$ on the first net.

21. The apparatus of claim 20, further comprising a graphical display algorithm for graphically displaying a location of $P_S$ on the first net.

22. The apparatus of claim 21, wherein said graphical display algorithm uses computer software having access to data which describes the first net geometrically.

23. The apparatus of claim 15, wherein τ is no greater than about $100A^2/I^2$, wherein A is in units of square mils, wherein I is in units of amperes, and wherein τ is in units of milliseconds.

24. The apparatus of claim 23, wherein A is no greater than about 1 square mil.

25. The apparatus of claim 23, wherein I is at least about 1 ampere.

26. The apparatus of claim 15, further comprising a microelectronic structure which includes the first net and the second net.

27. The apparatus of claim 26, wherein the microelectronic structure is selected from the group consisting of a chip, a chip carrier, and a circuit card.

28. A computer method for locating a short between a first net and a second net such that the short is at a point $P_S$ at a location on a path between points $P_A$ and $P_B$ on the first net, comprising the steps of:

providing a computer system having:
a memory device;
a computer code located on the memory device, said computer code including a calculational algorithm which calculates a length $L_{AS}$ along the path from $P_A$ to $P_S$;
a processor for executing the computer code; and
an output device;

providing input data for the computer code, including: a voltage drop $V_{AB}$ from $P_A$ to $P_B$, a voltage drop $V_{AC}$ from $P_A$ to a point $P_C$ on the second net, and geometric data describing a spatial distribution of an electrical wire network which includes the first net;

executing the computer code, wherein the calculational algorithm computes a length $L_{AS}$ of the path from $P_A$ to $P_S$ as a function of $V_{AC}/V_{AB}$ including utilizing the geometric data; and outputting $L_{AS}$ to the output device.

29. The computer method of claim 28, wherein the first net has a unit electrical resistance that is constant along the path, wherein the executing step includes: computing a length $L_{AB}$ of the path from $P_A$ to $P_B$ utilizing the geometric data; and computing $L_{AS}$ according to $L_{AS}=L_{AB}(V_{AC}/V_{AB})$.

30. The computer method of claim 28, wherein the step of providing input data further comprises providing electrical resistance data for describing a distribution of electrical resistance within the electrical wire network, wherein s is a path length variable along the path such that s=0 at $P_A$, and wherein the calculating step includes:

computing a unit electrical resistance R(s) by utilizing the geometric data in conjunction with the electrical resistance data;

computing $R_{AB}$ as an integral $\int R(s)ds$ over the path from $P_A$ to $P_B$; and solving the following equation for $L_{AS}$:

$$\int_0^{L_{AS}} R(s)ds = R_{AB}(V_{AC}/V_{AB}).$$

31. The computer method of claim 30, wherein R(s) is piecewise constant over the path.

32. The computer method of claim 30, wherein R(s) is piecewise continuous over the path.

33. The computer method of claim 28, further comprising: determining by the computational algorithm the location of $P_S$ on the first net; and outputting the location of $P_S$ on the first net to the output device.

34. The computer method of claim 33, wherein the computer code further comprises a graphical algorithm for graphically displaying the electrical wire network and portions thereof, wherein the step of executing the computer code further comprises executing the graphical algorithm for graphically displaying a portion of the electrical wire network in a manner which identifies the location of $P_S$ on the first net, and wherein the outputting step further comprises graphically displaying the portion of the electrical wire network.

35. The computer method of claim 28, wherein the step of providing input data includes an electronic transmission of $V_{AB}$ and $V_{AC}$ to the computer system from a first voltage measuring device that has measured $V_{AB}$, and electronic transmission of $V_{AC}$ to the computer system from a second voltage measuring device that has measured $V_{AC}$.

36. A computer system for locating a short between a first net and a second net such that the short is at a point $P_S$ at a location on a path between points $P_A$ and $P_B$ on the first net, comprising:

a memory device;

input data stored for use by a computer code, said input data including: a voltage drop $V_{AB}$ from $P_A$ to $P_B$, a voltage drop $V_{AC}$ from $P_A$ to a point $P_C$ on the second net, and geometric data describing a spatial distribution of an electrical wire network which includes the first net;

the computer code located on the memory device, wherein the computer code includes a calculation algorithm which utilizes $V_{AC}$, $V_{AB}$, and the geometric data to calculate a length $L_{AS}$ along the path from $P_A$ to $P_S$ as a function of $V_{AC}/V_{AB}$;

a processor which executes the computer code; and an output device which receives output from the computer code, said output including output data selected from the group consisting of $L_{AS}$, a graphical image displaying a location of the short, and a combination thereof.

37. The computer system of claim 36, wherein if the first net has a unit electrical resistance that is constant along the path then the calculational algorithm includes calculation of: a length $L_{AB}$ of the path from $P_A$ to $P_B$ based on the geometric data; and $L_{AS}$ according to $L_{AS}=L_{AB}(V_{AC}/V_{AB})$.

38. The computer system of claim 36, wherein the input data further comprises electrical resistance data which describes a distribution of electrical resistance within the electrical wire network, wherein s is a path length variable along the path such that s=0 at $P_A$, and wherein the calculational algorithm:

computes a unit electrical resistance R(s) by utilizing the geometric data in conjunction with the electrical resistance data;

computes $R_{AB}$ as an integral $\int R(s)ds$ over the path from $P_A$ to $P_B$, and solves the following equation for $L_{AS}$:

$$\int_0^{L_{AS}} R(s)ds = R_{AB}(V_{AC}/V_{AB}).$$

39. The computer system of claim 38, wherein R(s) piecewise constant over the path.

40. The computer system of claim 38, wherein R(s) piecewise continuous over the path.

41. The computer system of claim 36, wherein the calculational algorithm determines the location of $P_S$ on the first net including utilizing the geometrical data, and wherein the output device receives and displays the location of $P_S$.

42. The computer system of claim 36, wherein the computer code further comprises a graphical algorithm for graphically displaying the electrical wire network and portions thereof, wherein the graphical algorithm graphically displays a portion of the electrical wire network in a manner that identifies the location of $P_S$ on the first net, and wherein the output device receives and displays the portion.

43. The computer system of claim 36, further comprising:

the electrical wire network;

a constant current pulse source electrically connected between $P_A$ and $P_B$, wherein when activated the constant current pulse generates a constant current pulse;

a first voltage measuring device electrically connected between $P_A$ and $P_B$ wherein when activated the first voltage measuring device records a voltage drop $V_{AB}$ from $P_A$ to $P_B$; and a second voltage measuring device electrically connected between $P_B$ and a point $P_C$ on the second net, wherein when activated the second voltage measuring device records a voltage drop $V_{AC}$ from $P_A$ to $P_C$;

a first conductive line electrically coupling the first voltage device to the computer system through which $V_{AB}$ is transferred from the first voltage device to the computer system; and a second conductive line electrically coupling the second voltage device to the computer system through which $V_{AC}$ is transferred from the second voltage device to the computer system.

44. A computer program product, comprising:

a computer usable medium having a computer readable program code embodied therein for locating a short between a first net and a second net such that the short is at a point $P_S$ at a location on a path between points $P_A$ and $P_B$ on the first net, wherein the computer readable program code includes:

a utilization of input data for locating the short, wherein the input data comprises:

a voltage drop $V_{AB}$ from $P_A$ to $P_B$, a voltage drop $V_{AC}$ from $P_A$ to a point $P_C$ on the second net, and geometric data describing a spatial distribution of an electrical wire network which includes the first net and the second net, and a calculation of locational information selected from the group consisting of a length $L_{AS}$ along the path from $P_A$ to $P_S$ as a function of $V_{AC}/V_{AB}$, a graphical image displaying a location of the short, and a combination thereof.

45. The computer program product of claim 44, wherein the input data further comprises electrical resistance data for describing a distribution of locational information further utilizes the electrical resistance data.

* * * * *